United States Patent
Elson

(10) Patent No.: US 10,028,154 B2
(45) Date of Patent: Jul. 17, 2018

(54) ROTATABLE ANTENNA APPARATUS

(71) Applicant: Airspan Networks Inc., Boca Raton, FL (US)

(72) Inventor: David Charles Elson, Crewe (GB)

(73) Assignee: AIRSPAN NETWORKS INC., Boca Raton, FL (US)

( * ) Notice: Subject to any disclaimer, the term of this patent is extended or adjusted under 35 U.S.C. 154(b) by 212 days.

(21) Appl. No.: 15/187,159

(22) Filed: Jun. 20, 2016

(65) Prior Publication Data

US 2016/0380349 A1 Dec. 29, 2016

(30) Foreign Application Priority Data

Jun. 25, 2015 (GB) .................................. 1511200.6
Aug. 25, 2015 (GB) .................................. 1515093.1

(51) Int. Cl.
*H01Q 1/42* (2006.01)
*H04W 24/02* (2009.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
CPC ........................................................ H01Q 3/02
(Continued)

(56) References Cited

U.S. PATENT DOCUMENTS 497,147 A 5/1893 Urich
3,789,415 A 1/1974 Vickland
(Continued)

FOREIGN PATENT DOCUMENTS

CN 103247855 A 8/2013
CN 203733925U U 7/2014
(Continued)

OTHER PUBLICATIONS

UK Search Report from GB 1515091.5, dated Feb. 16, 2016, 4 pgs.
(Continued)

*Primary Examiner* — David S Luo
(74) *Attorney, Agent, or Firm* — Haynes Beffel & Wolfeld LLP

(57) ABSTRACT

A rotatable antenna apparatus has a fixed unit for attachment of the apparatus to an external structure, and a rotatable unit mounted on the fixed unit and comprising an antenna assembly and processing circuitry coupled to the antenna assembly for signal processing. An interface unit, coupled to both the fixed unit and the rotatable unit, routes a cable to provide a wired connection from the fixed unit to the processing circuitry. The interface unit includes a cable housing within which a coiled length of the cable is enclosed. A control mechanism coupled to the interface unit constrains the amount to which the length of cable is wound and unwound within the cable housing to inhibit application of a stretching stress on the cable during rotatable unit rotation. This provides a very efficient, cost effective mechanism for providing a wired connection to the processing circuitry included within the rotatable unit.

20 Claims, 16 Drawing Sheets

(51) Int. Cl.

| | | |
|---|---|---|
| G01S 19/53 | (2010.01) | |
| G01S 3/14 | (2006.01) | |
| G01S 5/02 | (2010.01) | |
| H01Q 1/02 | (2006.01) | |
| H01Q 3/04 | (2006.01) | |
| H01Q 3/24 | (2006.01) | |
| H01Q 3/26 | (2006.01) | |
| H01Q 21/06 | (2006.01) | |
| H01Q 21/08 | (2006.01) | |
| H01Q 21/20 | (2006.01) | |
| H01Q 21/28 | (2006.01) | |
| H01Q 25/00 | (2006.01) | |
| H04B 7/06 | (2006.01) | |
| H04W 28/02 | (2009.01) | |
| H04W 88/04 | (2009.01) | |
| H05K 7/20 | (2006.01) | |
| H04L 12/24 | (2006.01) | |
| H04L 29/08 | (2006.01) | |
| H04W 4/00 | (2018.01) | |
| H04W 16/28 | (2009.01) | |
| H04W 40/22 | (2009.01) | |
| H04W 72/08 | (2009.01) | |
| H04W 24/10 | (2009.01) | |
| H01Q 1/24 | (2006.01) | |
| H01Q 1/50 | (2006.01) | |
| H01Q 3/10 | (2006.01) | |
| H04W 72/04 | (2009.01) | |
| G01S 3/04 | (2006.01) | |
| G01S 19/24 | (2010.01) | |
| H01Q 1/36 | (2006.01) | |
| H01Q 3/12 | (2006.01) | |
| H01Q 21/00 | (2006.01) | |
| H01Q 1/12 | (2006.01) | |
| H01Q 3/02 | (2006.01) | |
| H01Q 3/36 | (2006.01) | |
| H01Q 21/24 | (2006.01) | |
| H04B 7/0456 | (2017.01) | |
| F16M 11/06 | (2006.01) | |
| H04L 12/26 | (2006.01) | |
| H04W 24/08 | (2009.01) | |
| H04W 28/24 | (2009.01) | |
| H04W 48/06 | (2009.01) | |
| H04W 4/50 | (2018.01) | |
| H04B 7/08 | (2006.01) | |
| H04W 84/04 | (2009.01) | |
| H04W 84/02 | (2009.01) | |
| H04W 88/08 | (2009.01) | |

(52) U.S. Cl.
CPC ............ *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/001* (2013.01); *H04W 4/50* (2018.02); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H04B 7/0817* (2013.01); *H04W 84/02* (2013.01); *H04W 84/045* (2013.01); *H04W 88/08* (2013.01)

(58) Field of Classification Search
USPC ........................................................ 318/3, 34
See application file for complete search history.

(56) References Cited

U.S. PATENT DOCUMENTS

| | | |
|---|---|---|
| 3,844,341 A | 10/1974 | Bimshas, Jr. et al. |
| 4,436,190 A | 3/1984 | Wentzell |
| 5,049,891 A | 9/1991 | Ettinger et al. |
| 5,357,259 A | 10/1994 | Nosal |
| 6,469,668 B1 * | 10/2002 | Jones ................ H01Q 1/084 343/702 |
| 2009/0032223 A1 | 2/2009 | Zimmerman et al. |
| 2016/0380350 A1 | 12/2016 | Elson et al. |

FOREIGN PATENT DOCUMENTS

| | | |
|---|---|---|
| CN | 104914412 A | 9/2015 |
| EP | 1093201 A1 | 4/2001 |
| EP | 1355376 A1 | 10/2003 |
| JP | H05139397 A | 6/1993 |
| WO | 2012115722 A1 | 8/2012 |

OTHER PUBLICATIONS

UK Search Report from GB 1515093.1, dated Feb. 19, 2016, 4 pgs.
PCT Search Report from PCT/GB2016/051411 (corresponding to U.S. Appl. No. 15/187,159), dated Aug. 1, 2016, 11 pgs.
PCT Search Report from PCT/GB2016/051433 (corresponding to U.S. Appl. No. 15/186,955), dated Aug. 9, 2016, 12 pgs.
PCT Written Opinion from PCT/GB2016/051411, dated May 30, 2017, 7 pgs.
PCT Written Opinion from PCT/GB2016/051433, dated May 30, 2017, 7 pgs.

* cited by examiner

In this Example Unwind Direction is Clockwise

ROTATABLE ANTENNA APPARATUS

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1515093.1, filed 25 Aug. 2015 and entitled "A ROTABLE ANTENNA APPARATUS". Both applications are incorporated by reference herein.

BACKGROUND

The present technique relates to a rotatable antenna apparatus, which may be used for example within a telecommunications system.

A rotatable antenna apparatus may be arranged to consist of a fixed unit that is attached to an external structure, for example an item of street furniture such as a lamp post, and a rotatable unit that is mounted on the fixed unit and includes an antenna assembly via which wireless communication signals are transmitted and received.

The antenna assembly needs to be connected to processing circuitry that is used to perform various signal processing operations on the signals to be transmitted by, or the signals received by, the antenna assembly. There are often a significant number of connections required between the antenna assembly and the associated processing circuitry, for example due to the number of individual antennas that may be provided within the antenna assembly, and it is desirable to reduce the length of those various connections in order to reduce signal loss. Accordingly, it would be desirable to place the processing circuitry within the rotatable unit mounted in close proximity to the antenna assembly, as this would reduce the above mentioned losses, and also gives rise to other improvements such as a reduction in lifetime wear issues that would otherwise be present in the various connections between the antenna assembly and the processing circuitry, and certain calibration difficulties that can arise if the processing circuitry is not mounted for rotation with the antenna assembly.

However, it is then necessary to provide an efficient and durable connection between the processing circuitry and the fixed unit of the apparatus.

SUMMARY

In one example configuration, there is provided a rotatable antenna apparatus comprising: a fixed unit for attachment of the apparatus to an external structure; a rotatable unit mounted on the fixed unit and comprising an antenna assembly and processing circuitry coupled to the antenna assembly for performing signal processing operations; an interface unit coupled to both the fixed unit and the rotatable unit, and through which a cable is routed to provide a wired connection from the fixed unit to the processing circuitry, the interface unit providing a cable housing within which a length of the cable is enclosed in a coiled arrangement; and a control mechanism coupled to said interface unit and arranged to constrain the amount to which the length of cable is wound and unwound within said cable housing so as to inhibit application of a stretching stress on said cable during rotation of said rotatable unit.

In accordance with this example configuration, an interface unit is coupled between the fixed unit and the rotatable unit and is used to route a cable from the fixed unit to the processing circuitry. Further, the interface unit has a cable housing within which a length of the cable is enclosed in a coiled arrangement. During rotation of the rotatable unit, the length of cable is wound or unwound within the cable housing, dependent on the direction of rotation, and a control mechanism is provided that is coupled to the interface unit and arranged to constrain the amount by which the cable is wound and unwound during such rotation, so as to inhibit application of a stretching stress to the cable.

Accordingly, it can be seen that the cable housing provides an enclosed protective environment for the length of cable contained therein, and also is arranged so as to allow the cable to be wound and unwound within the housing. Further, through use of a control mechanism it can be ensured that the cable is not overly wound or overly unwound, and hence prevent wear on the cable that could arise from subjecting the cable to a stretching force.

Accordingly, such a mechanism provides a cost effective and robust mechanism for allowing a wired connection to be made between the fixed unit and the processing circuitry within the rotatable unit.

There are a number of ways in which the rotatable unit may be mounted on the fixed unit. However, in one embodiment a shaft is connected to the rotatable unit and located for rotation within the fixed unit. In one such embodiment, the cable housing is located around the shaft. In one particular embodiment, the cable housing has an annular shape, with its inner circumference located around the shaft, and with the internal space within the cable housing being sufficient to allow the coiled arrangement of cable to be wound and unwound during rotation of the rotatable unit.

In one embodiment, the length of cable is arranged to move between an inner coiled configuration and an outer coiled configuration within the cable housing during rotation of the rotatable unit. Hence, at both of the extremities of movement, the length of cable takes a coiled configuration, either coiled around the inner circumferential edge of the cable housing or the outer circumferential edge of the cable housing, dependent on the direction in which the rotatable unit has been rotated.

The cable housing can be formed in a variety of ways, but in one embodiment comprises a fixed portion and a rotatable portion, with the length of cable being connected to both the fixed portion and the rotatable portion. In such an embodiment, the control mechanism may be arranged to cause the rotatable portion to rotate during rotation of the rotatable unit, whilst the fixed portion will typically be mounted to the fixed unit, and hence will not move during the rotation operation.

The control mechanism can be implemented in a variety of ways. In one embodiment, the rotatable unit includes a support for the antenna assembly and the processing circuitry, and the control mechanism comprises interengaging formations on the support and on the rotatable portion of the cable housing to cause the rotatable portion to rotate during rotation of the support. Hence, as the support is rotated, this will cause the rotatable portion to rotate, which in turn causes the length of cable to be wound and unwound within the cable housing due to the relative movement between the rotatable portion and the fixed portion of the cable housing.

The interengaging formations can take a variety of forms, but in one embodiment the interengaging formations comprise a protrusion extending from the rotatable portion and a recess in the support configured to receive the protrusion.

The recess may be shaped so as to provide a snug fit for the protrusion, but in an alternative embodiment the recess is a slot that allows the support to be rotated by a predetermined amount before the rotatable portion begins to rotate. In one embodiment, sufficient slack can be provided in the portion of the cable extending from the cable housing to the processing circuitry to allow for that predetermined amount of rotation to take place without putting any strain on that portion of the cable. This hence allows a slight increase in the amount by which the rotatable unit can rotate, relative to the amount by which the rotatable portion of the cable housing needs to rotate during movement of the cable between the inner coiled configuration and the outer coiled configuration, or vice versa.

In one embodiment, the control mechanism further comprises a calibration mechanism to detect a zero reference point at which the length of cable adopts a first coiled configuration. The support is then rotatable in a predetermined direction up to a specified maximum angle of rotation during which time rotation of the rotatable portion causes the length of cable to transition from the first coiled configuration to a second coiled configuration, both the first and second coiled configurations being configurations in which the length of cable is not subjected to said stretching stress.

By such an approach, it can be ensured that the apparatus is placed into a predetermined start position from where it is then known that a specified maximum angle of rotation may be imparted to the rotatable unit without subjecting the cable to the earlier mentioned stretching stress. In one embodiment, the first coiled configuration will correspond to either the earlier mentioned inner coiled configuration or outer coiled configuration, whilst the second coiled configuration would then correspond to the outer coiled configuration or inner coiled configuration, respectively. In one particular embodiment, the first coiled configuration corresponds to the inner coiled configuration and the second coiled configuration corresponds to the outer coiled configuration.

The calibration mechanism can take a variety of forms but in one embodiment comprises an actuator freely rotatable between first and second end stops, and a protruding element protruding from the support. During calibration the support is rotated in a direction opposite to said predetermined direction until the protruding element engages with the actuator and moves the actuator into contact with the first end stop.

In one embodiment, when the length of cable is initially wound within the cable housing, sufficient slack can be provided having regards to the maximum amount of rotation that will be required for the protruding element to engage with the actuator and move the actuator into contact with the first end stop, so that when that point is reached, and the length of cable has hence adopted the first coiled configuration, there will be no stretching stress on the length of cable whilst in that first coiled configuration.

There are a number of ways in which the point at which the actuator has been moved into contact with the first end stop by the protruding element can be detected. In one embodiment, the protruding element incorporates a switch mechanism that is activated when the first end stop prevents further movement of the actuator, to indicate that the zero reference point has been reached. In one particular embodiment, the switch mechanism may take the form of a micro-switch plunger located on the side of the protruding element that comes into contact with the actuator during the calibration operation.

In one embodiment, it is envisaged that following the calibration operation, the specified maximum angle of rotation can be imparted to the rotatable unit without the actuator being driven into contact with the second end stop. However, typically by the time that maximum angle of rotation has been reached, the actuator will be in the vicinity of the second end stop, and in one embodiment the second end stop provides a physical limit on the amount of rotation that can be applied to the rotating portion of the cable housing in said predetermined direction starting from the zero reference point. Accordingly, this provides a secondary mechanism for ensuring that the specified maximum angle of rotation is not exceeded, and in particular is not exceeded to an extent that significant stretching stress would be placed on the cable.

There are a number of ways in which the rotatable unit can be arranged to rotate relative to the fixed unit of the rotatable antenna apparatus. However, in one embodiment the rotatable antenna apparatus comprises a motor to rotate the support, the motor being arranged to limit its output so as to ensure that the support is not rotated in said predetermined direction by more than said specified maximum angle of rotation from the zero reference point.

The motor can take a variety of forms, but in one embodiment is a stepper motor that is programmed so as to only allow rotation up to the specified maximum angle starting from the calibrated zero reference point.

In one embodiment, the cable housing serves not solely to provide a protective environment in which the length of cable can wind and unwind, but is also arranged to constrain the cable in a predetermined orientation whilst the cable is wound and unwound within the cable housing. This allows for a reliable winding and unwinding of the cable between the first and second coiled configurations.

The cable can take a variety of forms but in one embodiment has a rectangular cross-section, and is orientated within the cable housing such that wider sides of the cable face each other in adjacent coils. This enables a more compact form of the cable housing to be achieved, whilst still providing sufficient space for the cable to be wound and unwound between the first and second coiled configurations.

Whilst in one embodiment only a single cable may be included within the cable housing, in an alternative embodiment an additional cable is interleaved with the cable in the cable housing. Hence, the same mechanism can be used to provide more than one cable connection between the fixed unit and the rotatable unit.

Furthermore, properties of one of the cables can assist in smooth winding and unwinding of the other cable. For example, in one embodiment the additional cable has a low surface friction. This can provide for smoother winding and unwinding of the main cable, even in situations where the coating on the main cable may not be particularly low friction, the additional cable effectively providing a smoother interface between the coils of the main cable in such an embodiment.

The cable can take a variety of forms, but in one embodiment the cable is an Ethernet cable. In one particular embodiment, a low cost flat Ethernet cable (such as an RJ-45 Ethernet cable) can be used with the above mentioned features of the described embodiments ensuring that the cable is subjected to a very low degree of wear during the rotation of the rotatable unit, and hence providing a very cost effective and long life solution.

If an additional cable is used, it can also take a variety of forms. In one embodiment, an additional cable is used to provide a power connection back from the processing circuitry of the rotatable unit to a lighting element on the base unit, which is for example lit to identify when the antenna apparatus has been turned on.

When utilising the above described techniques, a rotatable antenna apparatus can be provided where a significant degree of rotation can be imparted to the rotatable unit without placing a stretching stress on the cable interconnecting the processing circuitry of the rotatable unit with the fixed unit. In one embodiment, the specified maximum angle of rotation exceeds 360°, and in one particular embodiment is approximately 400°.

In a second example configuration there is provided a rotatable antenna apparatus comprising: a fixed means for attachment of the apparatus to an external structure; a rotatable means for mounting on the fixed means and comprising an antenna means and processing means coupled to the antenna means for performing signal processing operations; an interface means for coupling to both the fixed means and the rotatable means, and through which a cable is routed to provide a wired connection from the fixed means to the processing means, the interface means for providing a cable housing within which a length of the cable is enclosed in a coiled arrangement; and a control means for coupling to said interface means and for constraining the amount to which the length of cable is wound and unwound within said cable housing so as to inhibit application of a stretching stress on said cable during rotation of said rotatable means.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
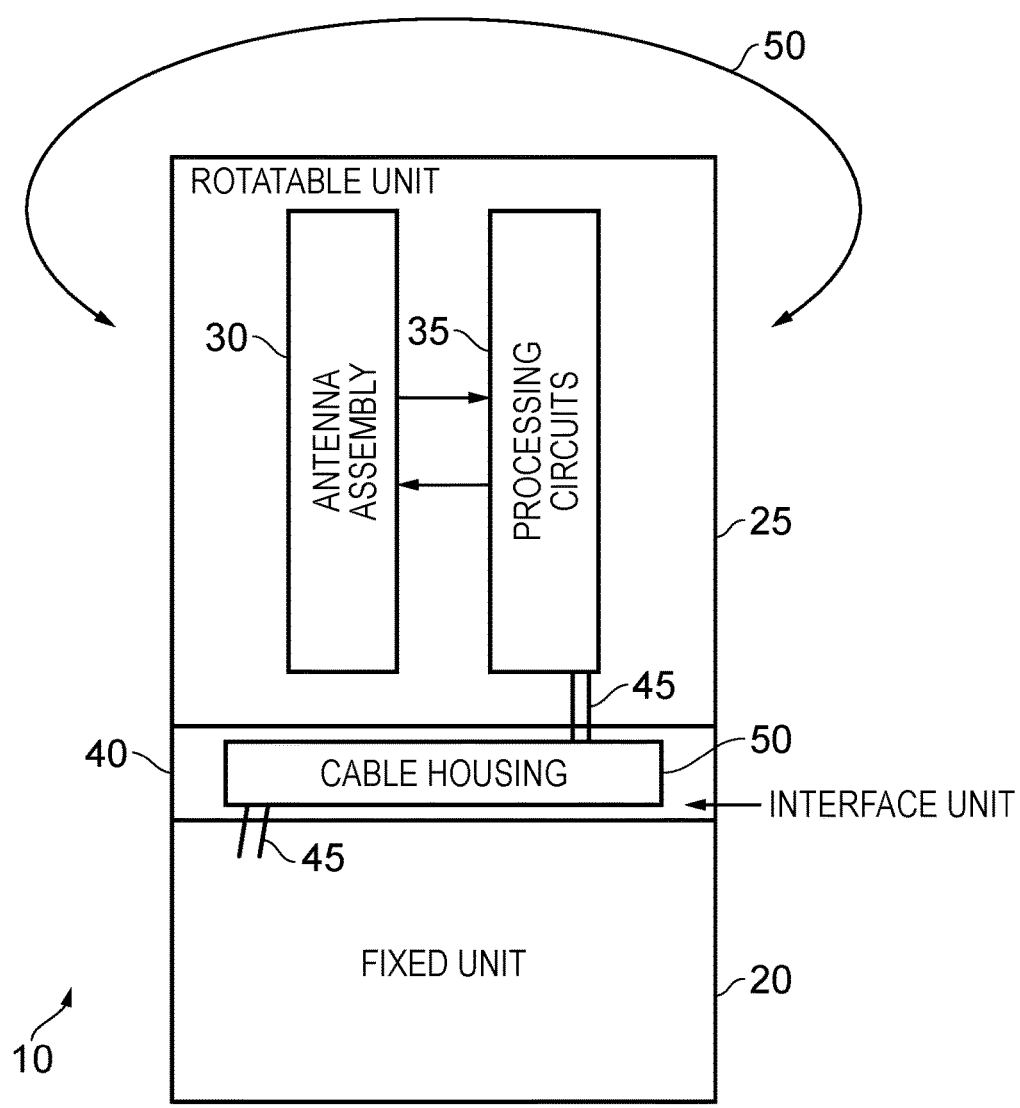
FIG. 1 is a block diagram of a rotatable antenna apparatus in accordance with one embodiment.

FIG. 1 is a block diagram illustrating a rotatable antenna apparatus in accordance with one embodiment. The apparatus includes a rotatable unit 25 mounted on a fixed unit 20 via an interface unit 40. The interface unit essentially consists of a cable housing 50 used to route a cable 45 from the fixed unit to processing circuits 35 provided within the rotatable unit 25. A number of connections are provided between the processing circuits 35 and an antenna assembly 30, to enable signals to be communicated between the antenna assembly and the processing circuits.

The rotatable antenna apparatus can take a variety of forms, but in one embodiment may be a transmit and receive antenna apparatus deployed within a telecommunications system to communicate with other antenna apparatuses distributed within the telecommunications system. By enabling the rotatable unit 25 to be rotated relative to the fixed unit 20, it is possible to point the antenna assembly 30 in a direction which enables the signal strength of communications between the apparatus and certain other antenna apparatuses within the telecommunications system to be improved, whilst minimising unwanted effects such as interference.

The antenna assembly 30 can take a variety of forms, but in one embodiment comprises an array of antenna elements each of which is arranged to communicate with the processing circuits 35. The processing circuits may for example comprise transceiver components used to process RF signals received by the antenna assembly 30, and to generate RF signals for transmission from the antenna assembly. A significant number of connections will typically be required between the antenna assembly 30 and the processing circuits 35, and by arranging the processing circuits to be provided in close proximity to the antenna assembly 30 within the rotatable unit 25, this can significantly reduce RF cable loss, reduce calibration issues, and improve the wear that might otherwise be exhibited in such RF cables were the processing circuits to instead be mounted within the fixed unit 20.

However, when allowing the rotatable unit 25 to rotate as shown by the arrow 50 in FIG. 1 with respect to the fixed unit 20, an issue that arises is how to reliably provide a wired connection between components in the fixed unit and the processing circuits 35. In particular, it is necessary to provide both power and a suitable bandwidth data connection to the processing circuits 35. In modern systems, the required bandwidth can be quite large, and indeed in one embodiment it is desired to be able to provide a gigabit Ethernet communication between the fixed unit and the processing circuits 35 within the rotatable unit 25. For this purpose, it is desirable to use a wired connection via a cable 45, but is important to provide a reliable communication link where wear on the cable is minimized. It is also often the case that the antenna apparatus has to be built from relatively low cost components, and accordingly it would be desirable to use standard, low cost, cabling to form the cable connection 45.

In one embodiment, the cable housing 50 is constructed in such a way as to enable standard cable to be used to provide the connection between the fixed unit 20 and the processing circuits 35, with the cable housing being arranged to operate in cooperation with a control mechanism that avoids application of a stretching stress on the cable 45 during rotation of the rotatable unit 25.

Figure 2:
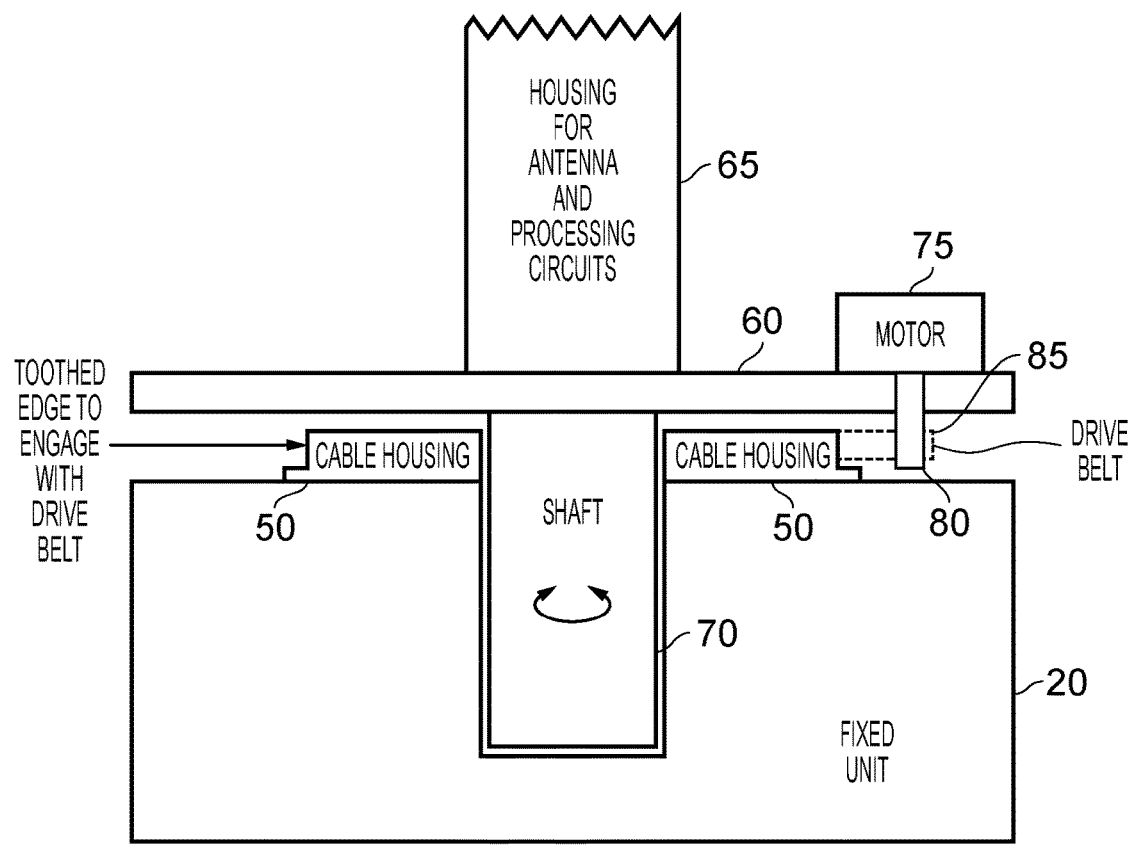
FIG. 2 is a block diagram illustrating in more detail components provided within the apparatus of FIG. 1 in accordance with one embodiment.

FIG. 2 is a block diagram illustrating some of the components of the apparatus 10 of FIG. 1 in more detail. In particular, a shaft 70 is connected to a support 60 on which a housing 65 is provided that incorporates both the antenna assembly 30 and the processing circuits 35.

The shaft is located for rotation within a recess of the fixed unit 20, thereby defining an axis of rotation for the rotatable unit. The cable housing 50 includes a fixed portion that is mounted onto the fixed unit, and a rotatable portion that cooperates with the support 60, and accordingly rotates as the support 60 is rotated.

There are a number of ways in which the rotatable part of the antenna can be caused to rotate about the axis defined by the shaft 70. However, in one embodiment a motor assembly 75 is provided on the support 60, connected to a spindle and pulley 80 that cooperates with a drive belt 85 that is also wrapped around a perimeter of the fixed portion of the cable housing 50. That perimeter of the fixed portion of the cable housing includes in one embodiment a toothed edge which engages with the drive belt. As a result, when the motor 75 drives the spindle/pulley 80, this causes the support 60 to rotate with respect to the fixed portion of the cable housing 50 that is connected to the fixed unit 20.

Figure 3A:
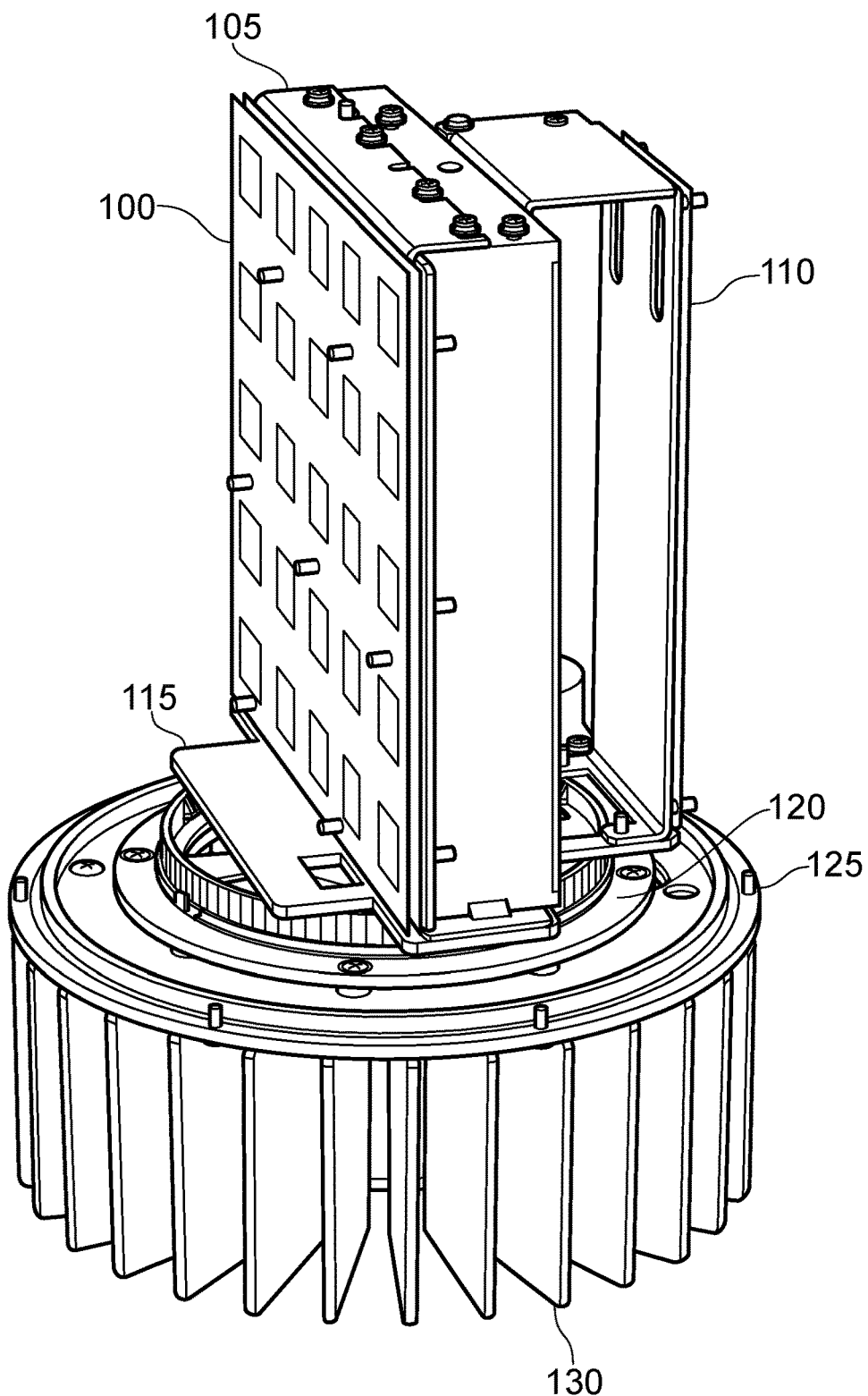
FIG. 3A illustrates components of a rotatable antenna apparatus in accordance with one embodiment.

FIG. 3A is a diagram illustrating component of the antenna apparatus in accordance with one particular embodiment. Within the rotatable unit of the antenna, a housing 105 is provided within which the processing circuits are contained. On a front face of the housing an antenna array 100 is provided. Optionally, a reverse facing antenna assembly 110 may also be provided as shown. The antenna assembly and housing 105 containing the processing circuits is mounted on the support plate 115, which in turn is mounted on a shaft (not visible in FIG. 3A) that extends into the fixed unit 125 to define an access of rotation of the rotatable unit. As shown in FIG. 3A, the fixed unit includes in one embodiment a heat sink 130, and a mechanism is provided for drawing heat from the components in the rotatable unit to the heat sink 130.

As shown in FIG. 3A, the cable housing 120 has a fixed portion which is mounted on the fixed unit 125, and as shown in the figure an upstanding edge of the fixed portion has a series of teeth which can engage with the drive belt discussed earlier with reference to FIG. 2.

Figure 3B:
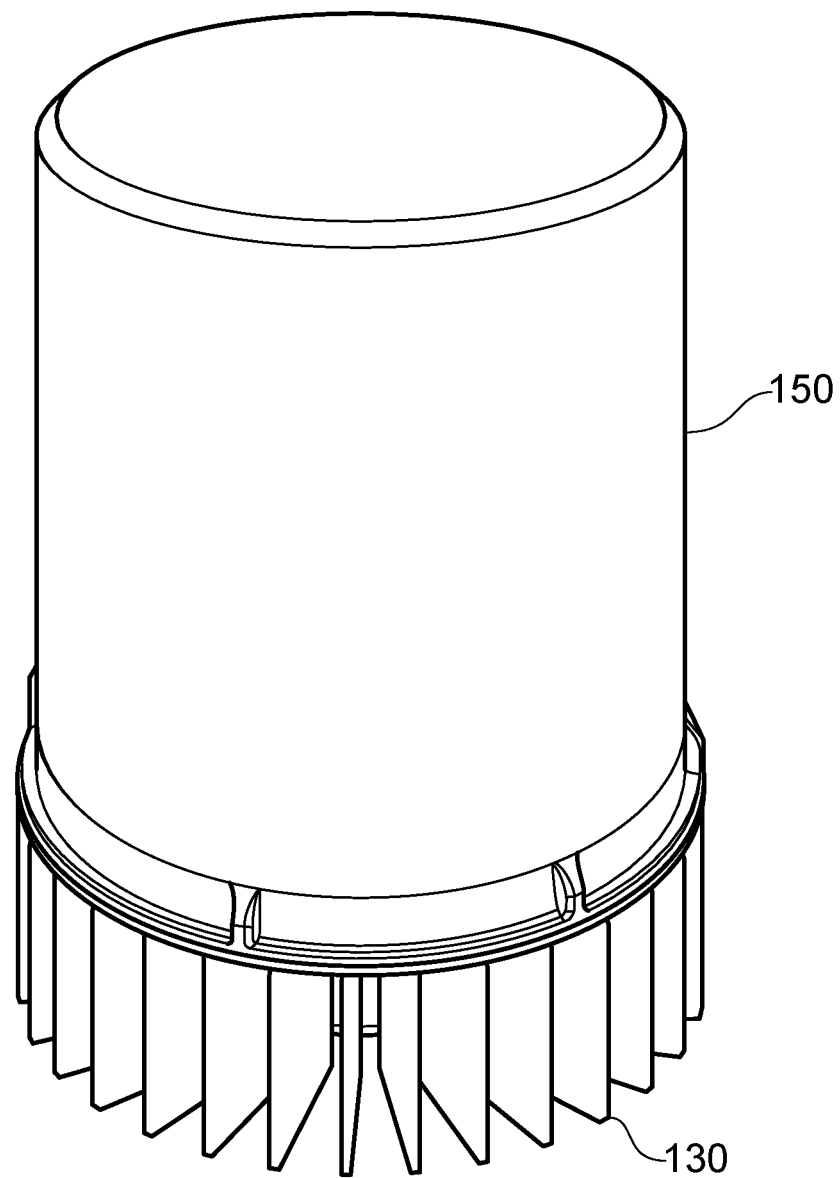
FIG. 3B illustrates the apparatus of FIG. 3A with a radome attached.

FIG. 3B illustrates the rotatable antenna apparatus with a radome 150 provided over all of the components in the rotatable unit. The radome 150 provides a sealed environment for the components within the rotatable part of the antenna, protecting them from moisture ingress. Heat generated by components within the sealed environment created by the radome 150 is dissipated via the heat sink 130 in the fixed unit of the antenna.

Figure 4A:
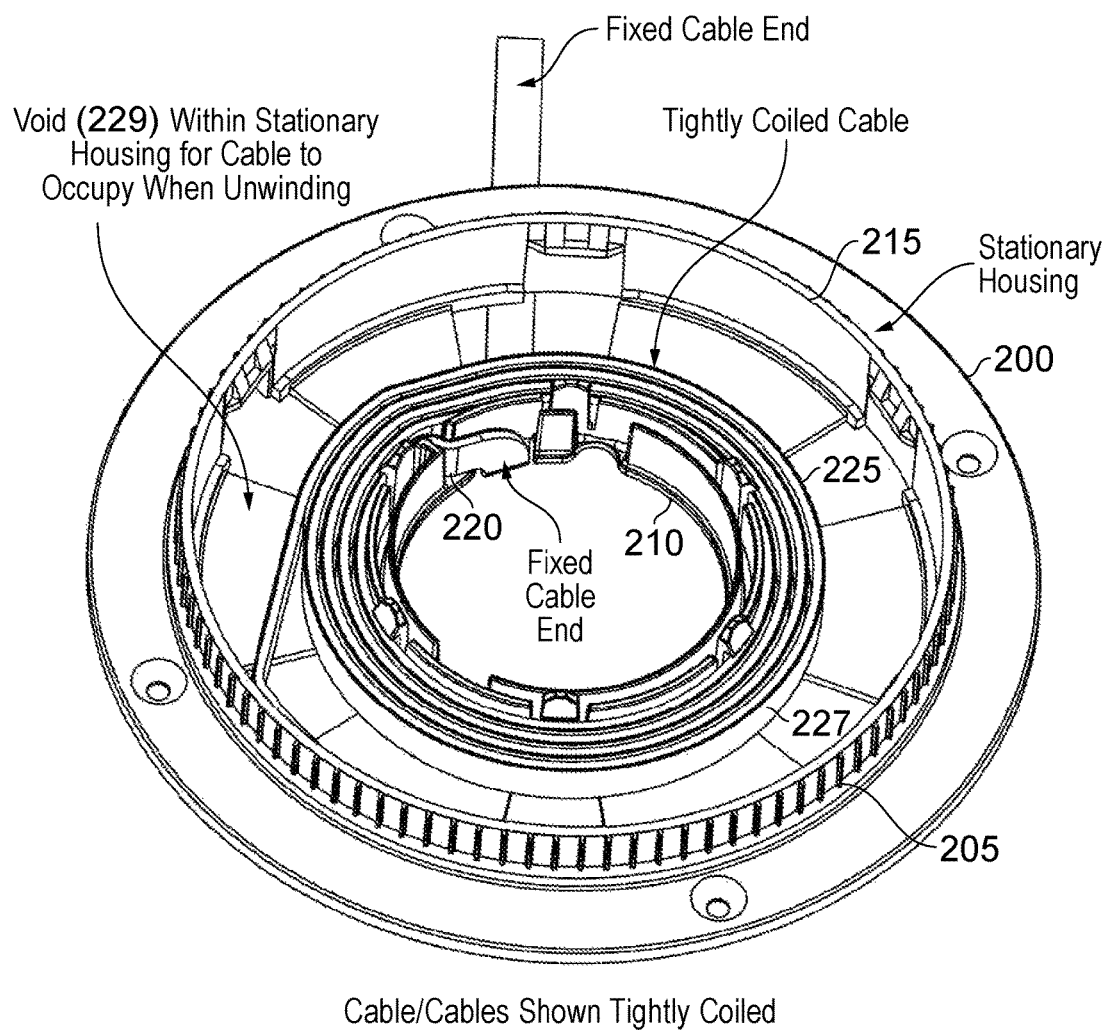
FIG. 4A illustrates a fixed portion of the cable housing in accordance with one embodiment, with a length of cable wound into a first coiled configuration within the cable housing.

FIG. 4A illustrates in more detail a fixed portion of the cable housing 50 of one embodiment, in FIG. 4A this fixed portion also being referred to as a stationary housing. The stationary housing 200 includes an outer perimeter wall 215 and an inner perimeter wall 210. As shown in FIG. 4A, the outer perimeter wall 215 contains a series of teeth 205 that can engage with a drive belt as discussed earlier with reference to FIG. 2. A length of cable 225 is initially wound around the inner edge 210 of the housing to adopt an inner coiled configuration. The cable is also clamped at the entry point 220, with the cable then extending underneath the stationary housing 200 from where it can be routed to required connections within the fixed unit 20 of the antenna apparatus.

Whilst the cable portion 225 within the cable housing 200 is shown as being tightly coiled around the inner edge 210, it will typically be coiled in a manner such that no stretching stress is applied to the cable whilst in the inner coiled configuration shown.

Whilst in one embodiment a single cable may be wound within the cable housing, in another embodiment an additional cable may be interleaved with the main cable 225 as shown by the lightly coloured cable 227 in FIG. 4A.

The cable/cables can take a variety of forms, but in one embodiment are flat cables as shown in FIG. 4A, orientated such that the wider diameter of the cable extends perpendicularly from the base of the stationary housing 200. This provides a particularly compact winding configuration.

In one embodiment where a secondary cable 227 is also used, that secondary cable is arranged to have a relatively low surface friction, hence effectively providing a lubricating interface between the adjacent coils of the main cable 225, and serving to improve the smoothness of the winding and unwinding of the portion of the cable(s) enclosed within the stationary housing 200.

Figure 6A:
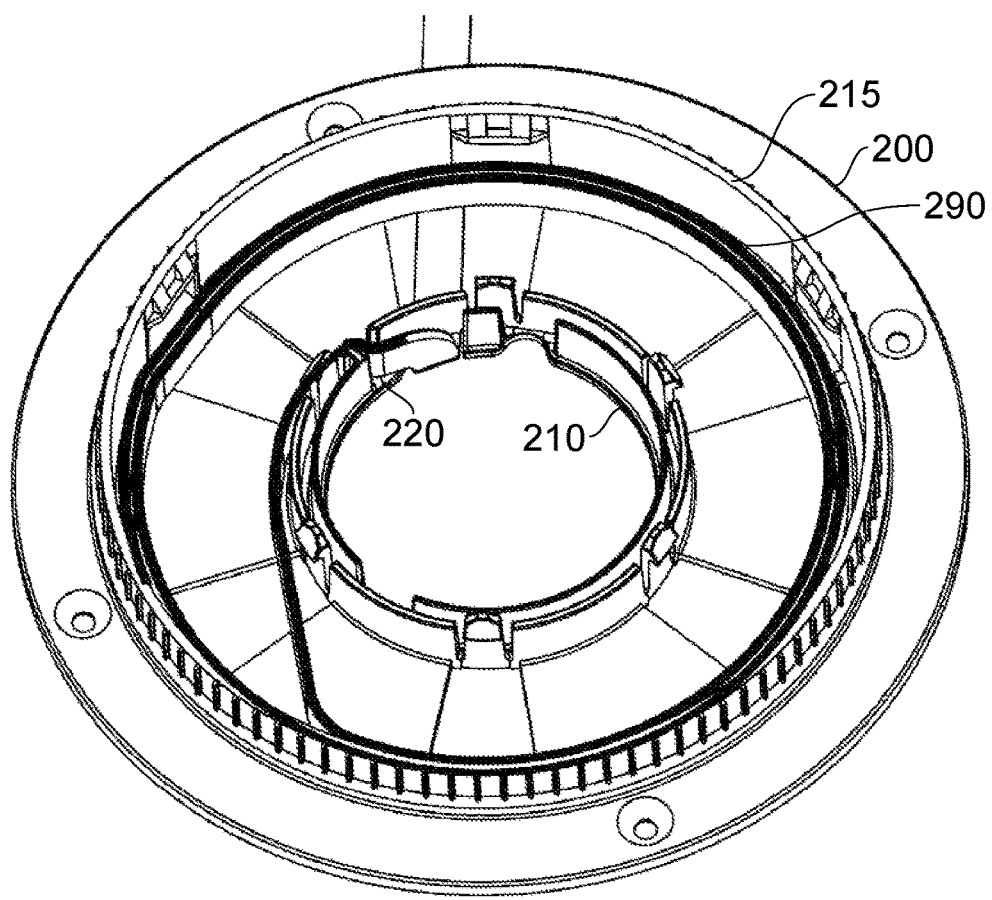
FIGS. 6A and 6B correspond to FIGS. 4A and 4B, but illustrate the cable adopting a second coiled configuration within the housing.
Figure 6B:
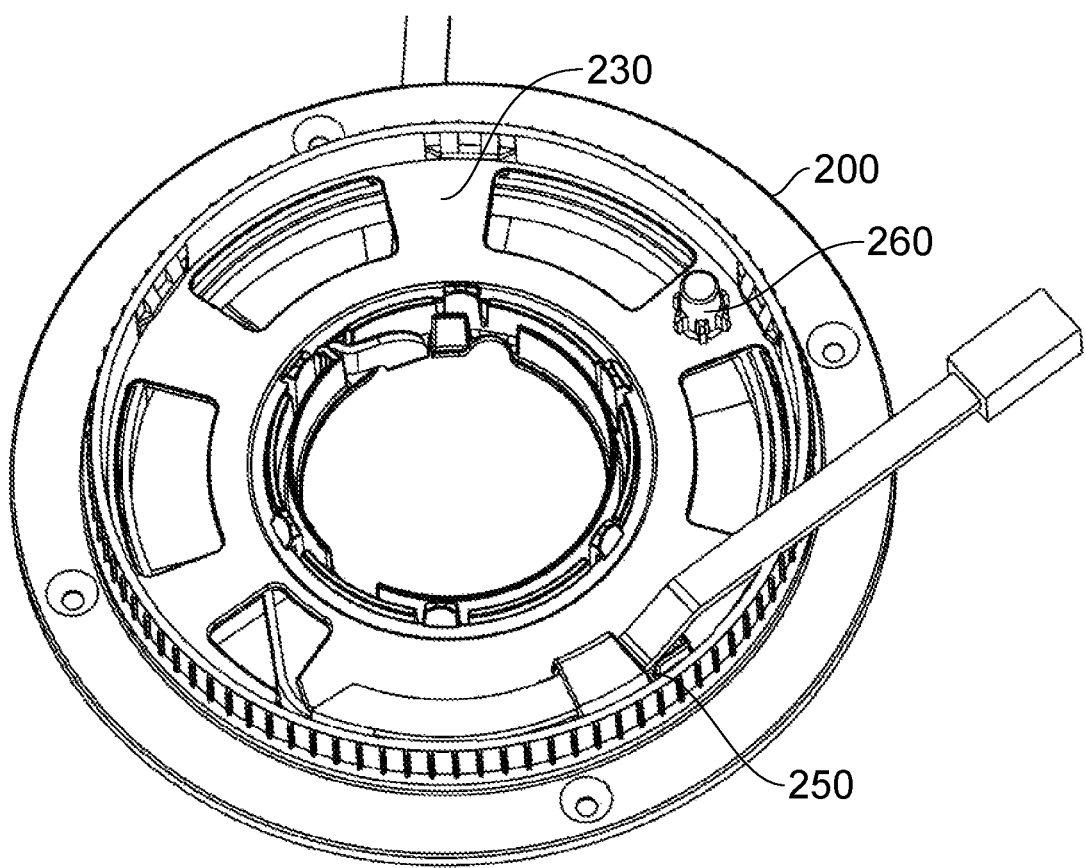

As shown in FIG. 4A, there is a void 229 into which the cable can unwind during use of the cable housing, as will be discussed later with reference to FIGS. 6A and 6B.

Figure 4B:
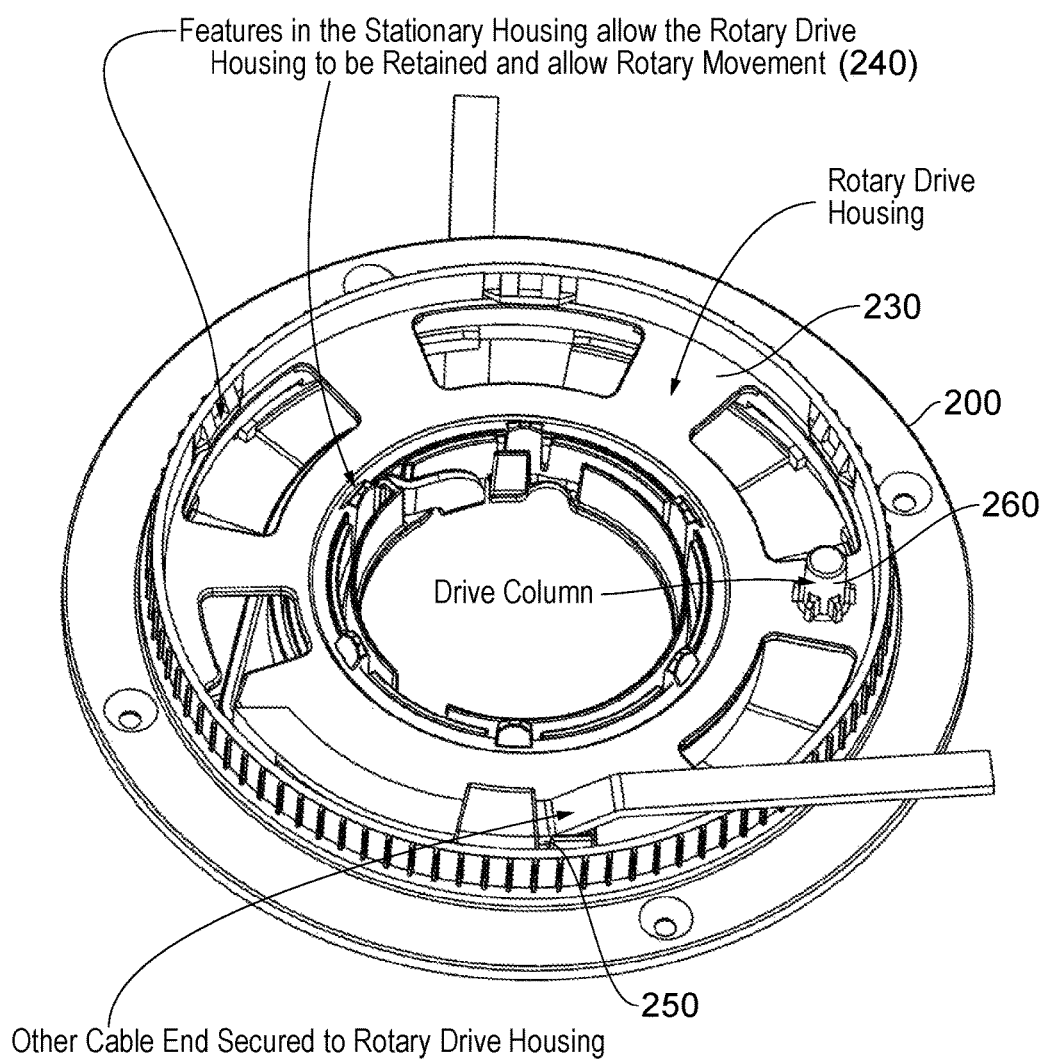
FIG. 4B illustrates the incorporation of a rotating portion of the cable housing within the fixed portion shown in FIG. 4A, in accordance with one embodiment.

FIG. 4B illustrates a rotatable portion 230 of the cable housing, also referred to in FIG. 4B as a rotary drive housing. This rotary drive housing 230 can be fixed in place within the stationary housing 200 via appropriate engaging features such as the elements 240 shown in FIG. 4B. Once the rotary drive housing 230 has been located in place, the cable housing then provides an enclosure for the length of cable accommodated within the cable housing. As mentioned earlier, at the inner peripheral edge 210, the cable is clamped at location 220 shown in FIG. 4A. Similarly, at the outer peripheral edge, the other end of the length of cable is clamped at the location 250 on the rotary drive housing 230. Hence, the length of cable contained within the cable housing is fixed, and rotation of the rotary drive housing 230 relative to the stationary housing 200 will cause the length of cable to unwind from the inner coiled configuration shown in FIG. 4A. As shown in FIG. 4B, a drive column 260 is located on the rotary drive housing 230, which can engage with a cooperating feature on the rotatable unit of the antenna in order to cause the rotary drive housing 230 to rotate during rotation of the rotatable unit of the antenna.

Figure 5:
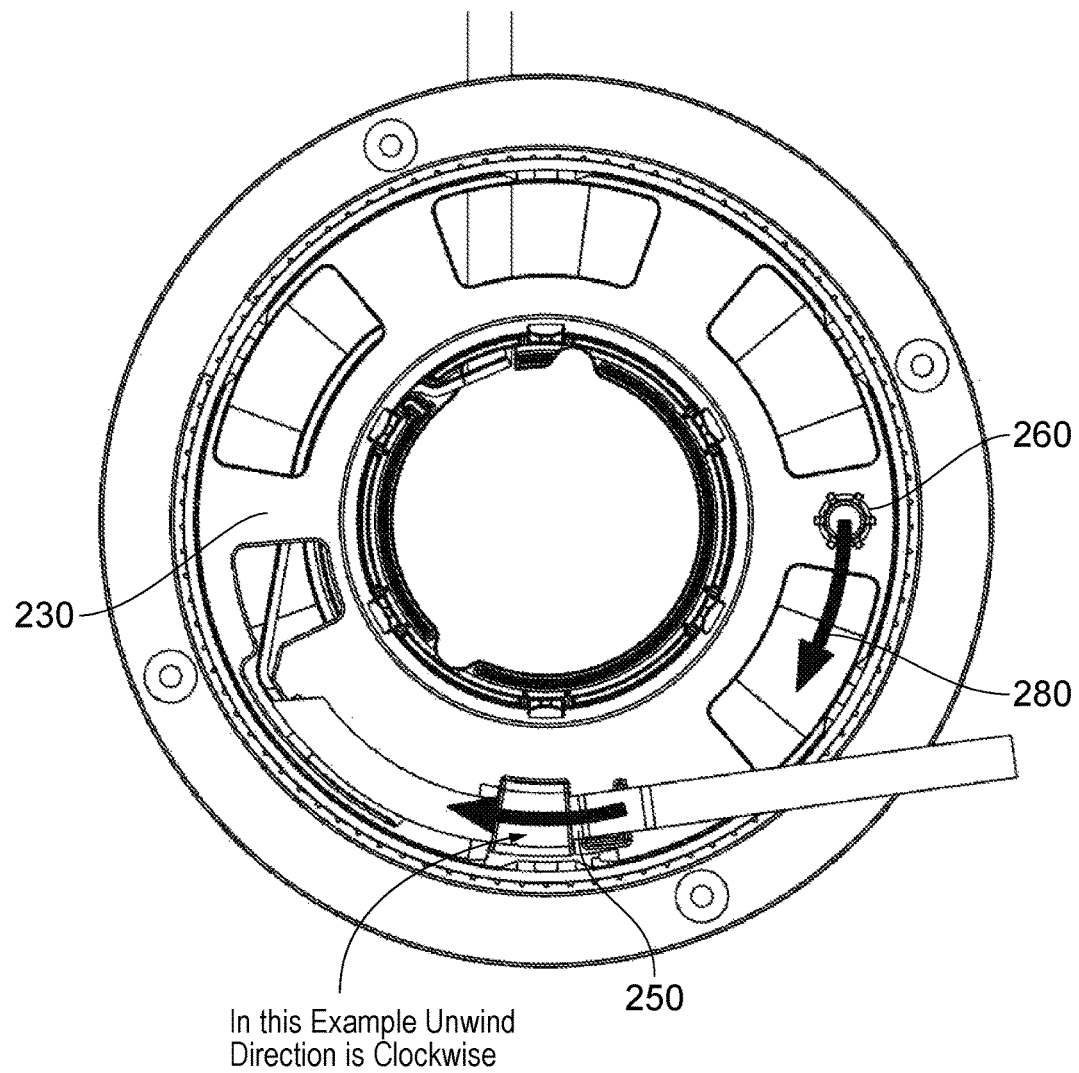
FIG. 5 illustrates a direction of rotation of the rotatable portion of the housing which causes the cable to unwind towards a second coiled configuration.

FIG. 5 schematically illustrates how a rotating force applied to the drive column 260 in direction 280 causes the rotary drive housing 230 to rotate in order to unwind the portion of the cable contained within the housing. In this example, the unwind direction is clockwise when viewed from above the cable housing, and causes the cable to unwind as shown in FIGS. 6A and 6B, FIGS. 6A and 6B corresponding to FIGS. 4A and 4B, but showing the cable portion adopting an outer coiled configuration 290 where the coils of cable are constrained by the outer peripheral wall 215 of the stationary housing 200.

The amount of cable rotation allowed by the cable housing is dependent upon the surface area of the cable chamber between the inner and outer walls 210, 215. In one embodiment, the size of the chamber and the associated cable size is such that it allows for just over 400° of movement. Increasing the chamber size would increase the degrees of movement allowable.

Figure 7A:
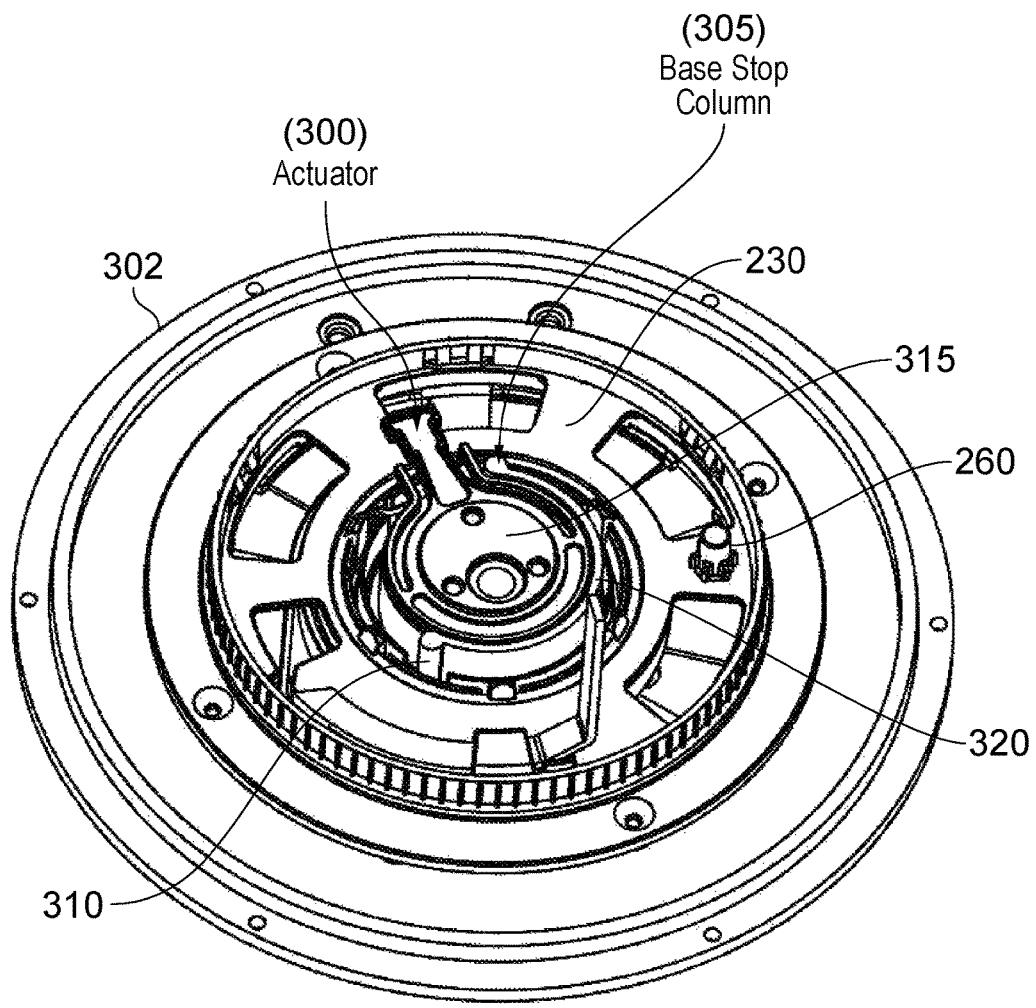
FIGS. 7A and 7B illustrate an actuator provided in accordance with one embodiment, along with associated end stops used to constrain the movement of the actuator.

FIG. 7A shows the cable housing formed by the fixed 200 and rotatable 230 parts located on the base portion 302 forming part of the fixed unit 20 of the rotatable antenna apparatus. The base 302 has a curved shoulder region 320 in the middle, around which the cable housing is located. In addition, a freely rotating shaft 315 is located inside the shoulder region 320, and extends into the base 302.

In one embodiment, the control mechanism used to constrain the extent to which the cable within the cable housing is wound and unwound within the cable housing during operation includes not only the drive column 260 that engages with a corresponding recess in the support 60, but further comprises a calibration mechanism used to detect a zero reference point, this being a location at which the cable within the housing adopts a first coiled configuration, in one embodiment the inner coiled configuration discussed earlier with reference to FIG. 4A.

Figure 7B:
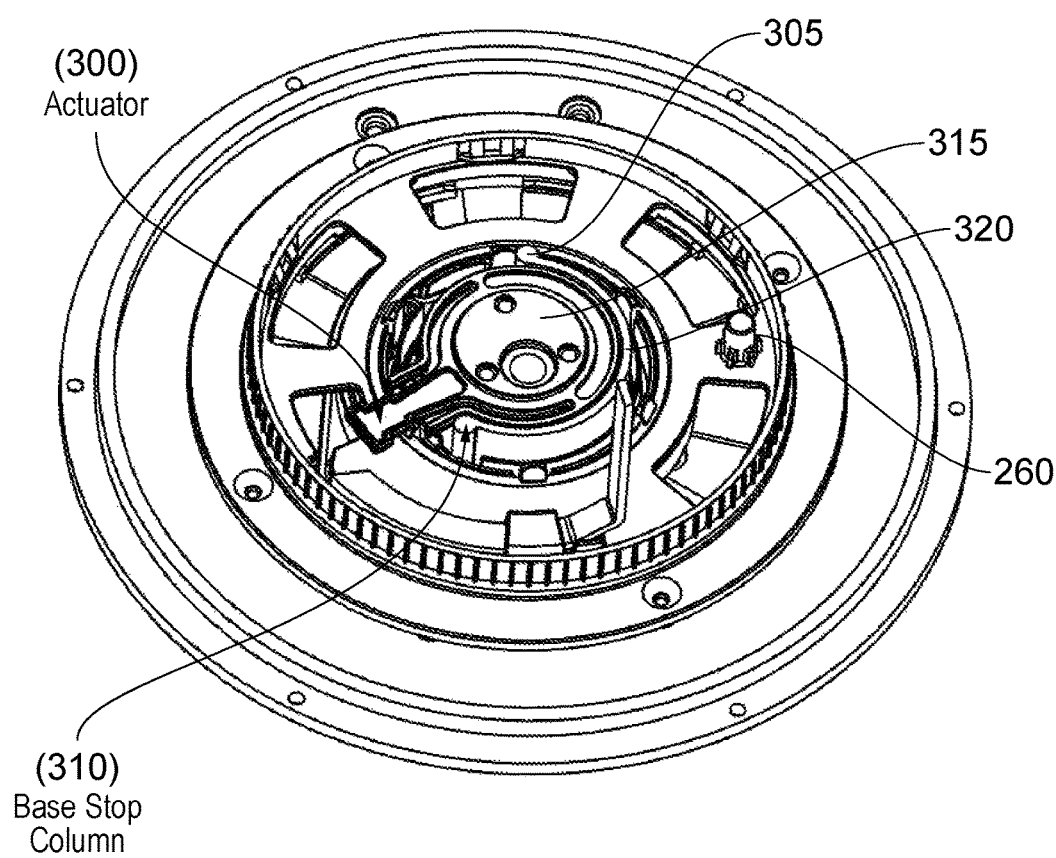

Part of the calibration mechanism is formed by the actuator 300 extending from a disc shaped insert that fits over the shaft 315 so as to surround the shaft. The actuator 300 can freely move between two end stops 305, 310 provided in the upstanding portion 320 of the base. FIG. 7A shows the actuator located adjacent one end stop 305, whilst FIG. 7B shows the actuator 300 located against the other end stop 310. In one embodiment, the end stops are formed by columns provided on the base 302.

Figure 8:
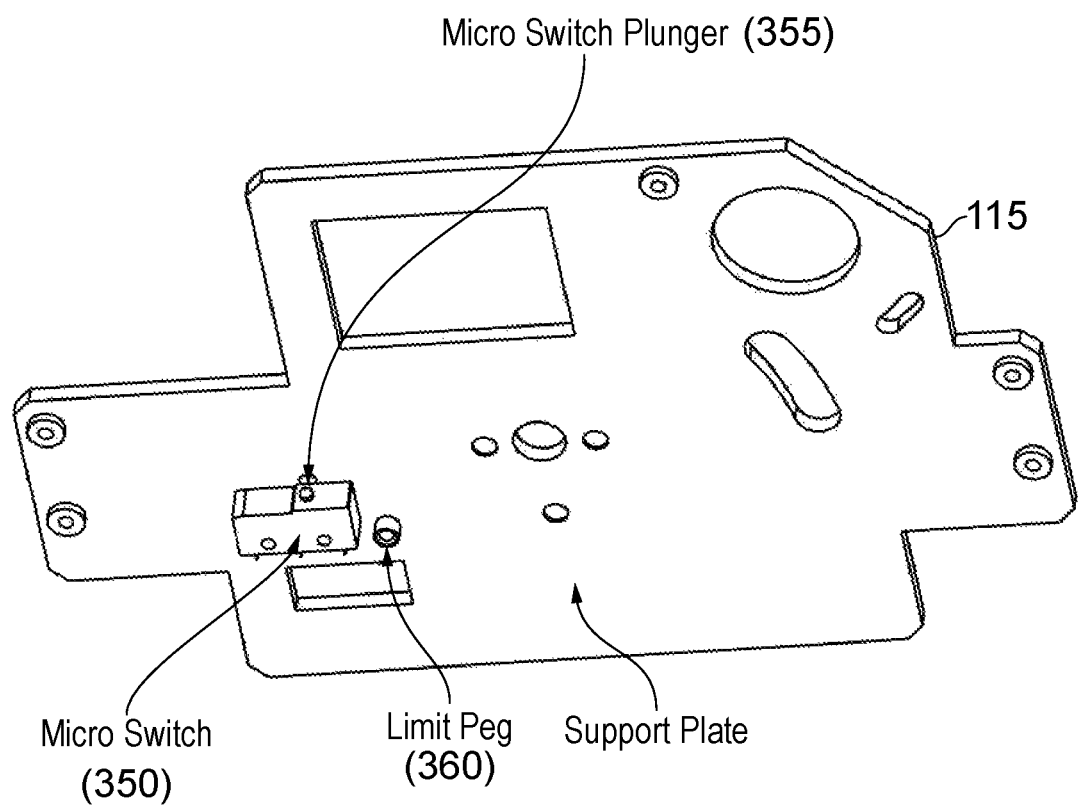
FIG. 8 illustrates the support used within the rotatable part of the antenna apparatus to support both the antenna array and the associated processing circuits, in accordance with one embodiment.

The remainder of the calibration mechanism is provided by features on the underside of the support plate 115, as shown in more detail in FIG. 8. In particular, a protruding element 350 is provided extending from the underside of the support plate, which in one embodiment is formed by the housing of a micro-switch. A micro-switch plunger 355 is then provided on one face of the micro-switch 350. As also shown in FIG. 8, a limit peg 360 is also provided protruding from the underside of the support plate 115.

Figure 9:
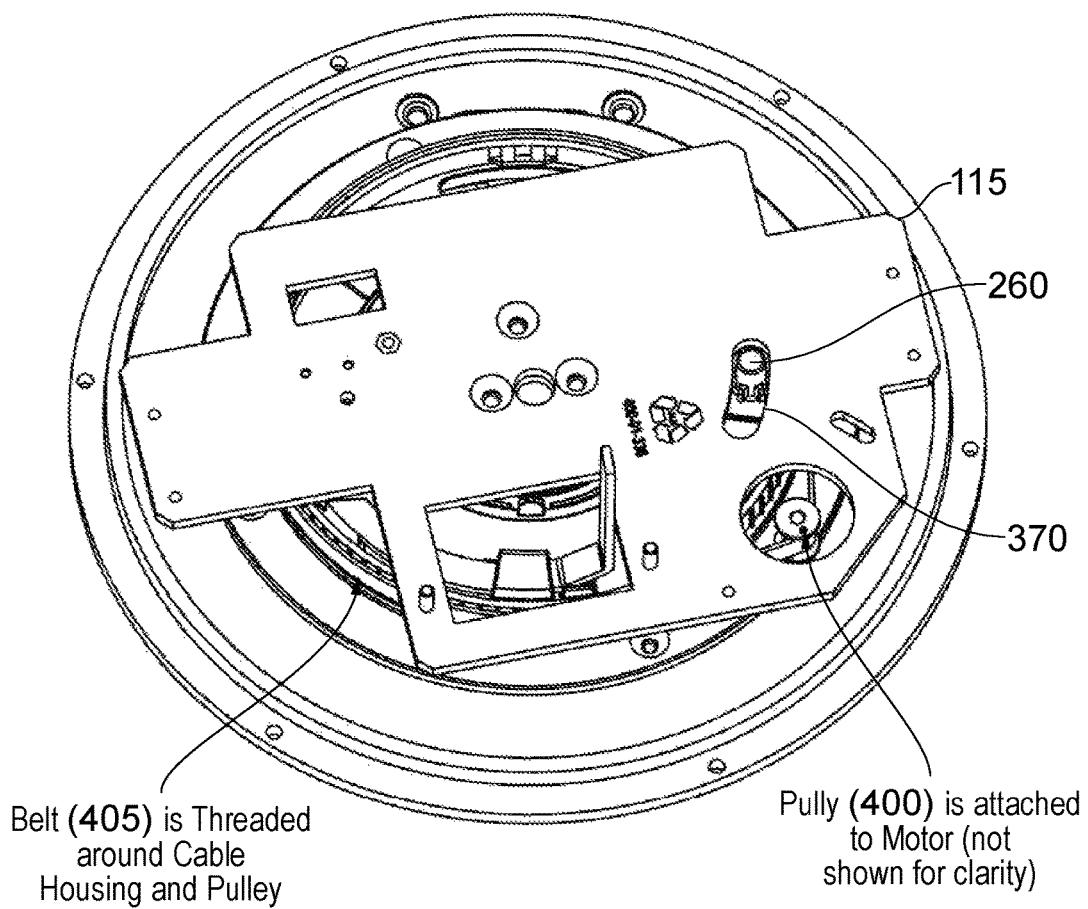
FIG. 9 shows the support mounted onto the cable housing in accordance with one embodiment.

The support plate is secured onto the shaft 315, as illustrated in FIG. 9. In the embodiment shown, the support plate 115 is attached to the shaft 315 via three screws provided through the locating holes shown in FIG. 9. As can be seen in FIG. 9, the drive column 260 extends through a recess 370 provided in the support plate 115. The drive column 260 and associated recess 370 form interengaging formations of the control mechanism that cause the rotatable part of the cable housing to rotate when the support plate is itself rotated during operation of the rotatable antenna. Through the use of an elongate recess 370 as shown, it is possible to allow for a small range of movement of the rotatable antenna to take place prior to the cable housing being activated to wind or unwind the length of cable held within the cable housing. This allows a further extension to the total range of rotation of the antenna.

As also shown in FIG. 9, a pulley 400 is provided that is attached to a motor located on top of the support plate 115, the motor having been omitted so as to allow the detail of the pulley to be shown. As can be seen, a belt 405 is threaded around the cable housing and the pulley, such that when the motor causes the pulley to rotate, this will cause the support plate to rotate relative to the fixed portion 200 of the cable housing.

Figure 10A:
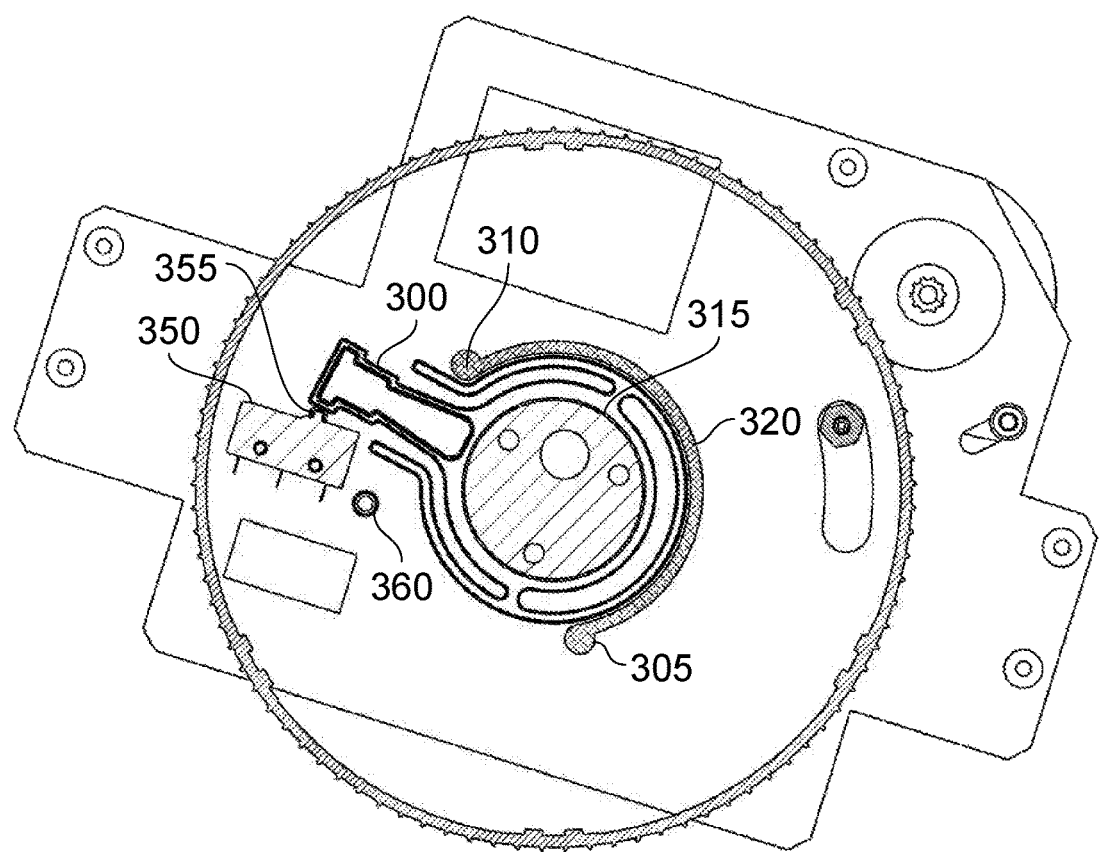
FIGS. 10A, 10B and 10C provide a plan view looking up from underneath the arrangement shown in FIG. 9, to illustrate how a micro-switch and limit peg shown in FIG. 8 cooperate with the actuator during operation of the apparatus in accordance with one embodiment.
Figure 10B:
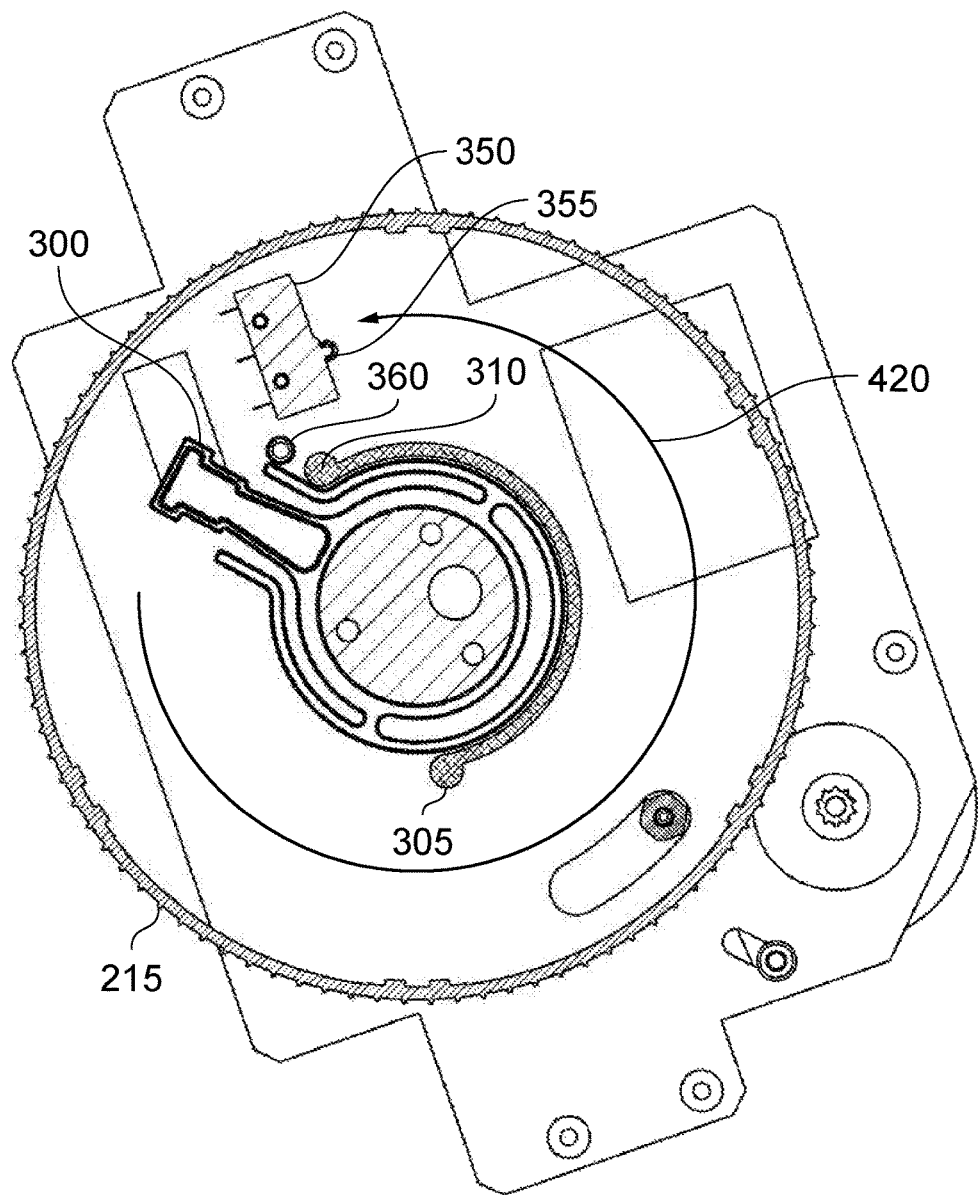
Figure 10C:
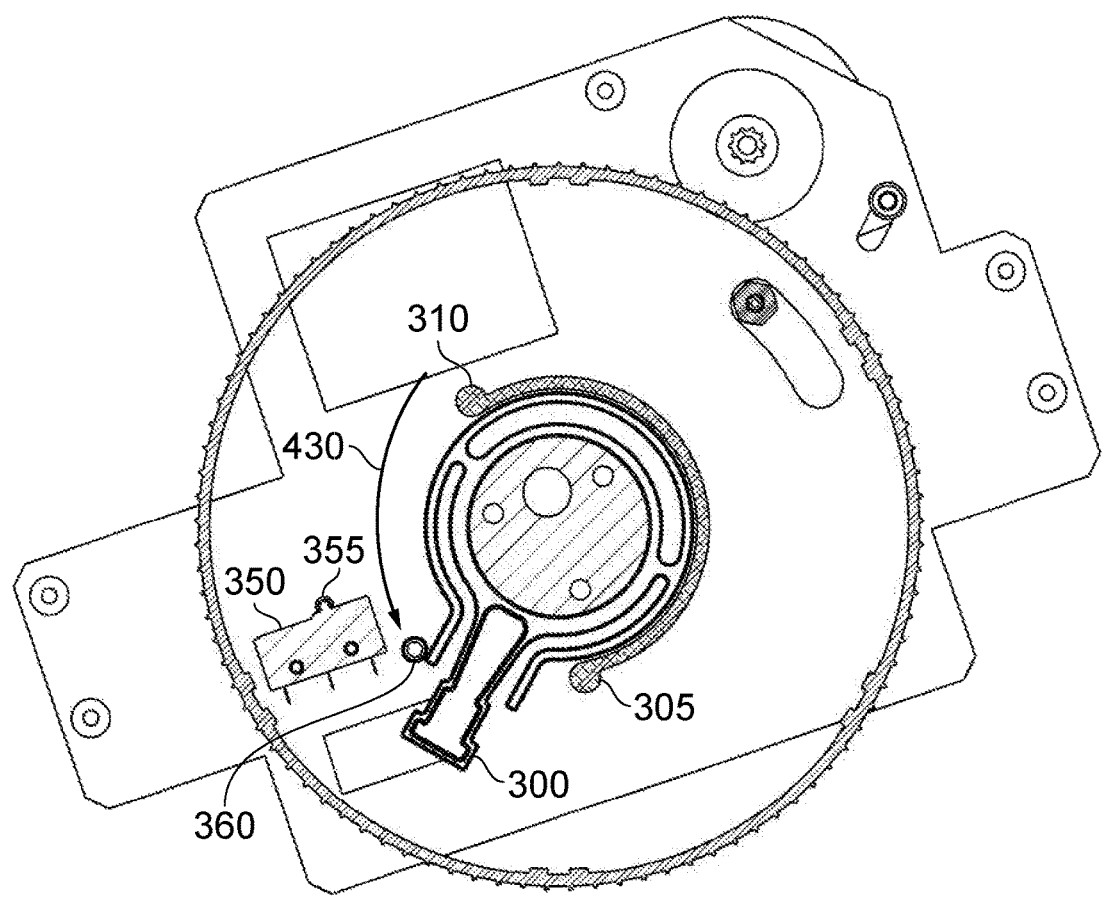

The manner in which the actuator 300 cooperates with the micro-switch 350 and limit peg 360 provided on the underside of the support plate 115 will now be illustrated with reference to FIGS. 10A to 10C. In FIGS. 10A to 10C, a view is shown looking up towards the underside of the support plate 115 from the direction of the fixed base unit. When the motor is powered in the calibration stage, it will move the support plate assembly including the micro-switch 350 anticlockwise when viewed from above, and hence clockwise when viewed from the direction of FIG. 10A. This will cause the protruding element formed by the micro switch 350 to contact the freely moving actuator 300 and move it towards the end stop 310. When the actuator 300 reaches the end stop 310, the micro-switch plunger 355 will then be depressed in order to indicate that the end stop position has been reached. The action of depressing the plunger will stop the motor from rotating further.

The motor controller then uses this position as its zero reference point. The motor controller can then cause the motor to move the support plate assembly clockwise to a desired position up to a maximum rotation set within the controller programming, which in one embodiment is 400° of movement. As shown in FIG. 10B, the support plate can hence rotate clockwise as viewed from above, or anticlockwise as viewed from the direction of FIG. 10B, as shown by the arrow 420, until such a time that the limit peg 360 comes into contact with the actuator 300. In one embodiment, this occurs after about 330° of movement. Continued rotation in the same direction will then cause the actuator 300 to be moved due to its contact with the limit peg 360, the actuator moving within its free movement area until the maximum allowed rotation has been reached, which in one embodiment is 400°. This is shown schematically in FIG. 10C, where the remaining rotation 430 is rotation during which time the actuator 300 is moved under the control of the limit peg.

As will be apparent from FIG. 10C, in one embodiment, when the end of the range of movement as programmed into the motor is reached, the actuator 300 will not quite have reached its other end stop position indicated by the end stop 305. Hence, in this embodiment, it is assumed that the motor controller can effectively control the amount of rotation applied to the support plate once the zero reference position has been located. However, in one embodiment the second end stop 305 can provide a physical backup mechanism for ensuring that the antenna assembly is not over rotated, which could place a stretching stress on the portion of the cable contained within the cable housing.

In the above described embodiments, it will be seen that such embodiments provide an elegant and cost effective mechanism for allowing a wired connection to be made between the fixed unit of a rotatable antenna apparatus and processing circuitry provided within a rotatable unit of the rotatable antenna apparatus. A predetermined length of cable is constrained to be retained within a cable housing made up of a rotatable part and a fixed part, and during rotation of the rotatable unit of the antenna apparatus, the coiled arrangement of cable within the cable housing is arranged to transition between an inner coiled configuration and an outer coiled configuration. A control mechanism is provided to constrain the amount by which the cable within the housing is wound and unwound within the cable housing during rotation of the rotatable unit so as to inhibit application of a stretching stress on that cable. It has been found that such an approach enables low cost standard cabling to be used to provide a high data bandwidth connection between the fixed base unit and the processing circuitry in the rotatable unit of the rotatable antenna apparatus.

In one embodiment, the cable housing takes an annular form and can be located around a central shaft that can freely rotate within the base unit of the antenna. The shaft supports the rotation of the rotatable unit of the antenna apparatus, and when using the cable housing approach of the described embodiment it will be seen that the formation and operation of the shaft is unaffected by the cable routing mechanism.

It has been found that a rotatable antenna apparatus incorporating the cable housing and associated control and calibration mechanisms of the above described embodiments can be manufactured in high volumes at low cost, and hence provides an attractive solution for many deployment scenarios requiring rotatable antenna apparatus. In one particular embodiment, such a rotatable antenna apparatus can be deployed in a wireless backhaul network used to connect an access network such as a mobile phone network with the wired telecommunications infrastructure. In one embodiment, such rotatable antenna apparatus can be used at any of the nodes in the backhaul network, and due to the relatively low cost can be readily deployed in a small-cell system.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

I claim:

1. A rotatable antenna apparatus comprising:
a fixed unit for attachment of the apparatus to an external structure;
a rotatable unit mounted on the fixed unit and comprising an antenna assembly and processing circuitry coupled to the antenna assembly for performing signal processing operations;
an interface unit coupled to both the fixed unit and the rotatable unit, and through which a cable is routed to provide a wired connection from the fixed unit to the processing circuitry, the interface unit providing a cable housing within which a length of the cable is enclosed in a coiled arrangement; and
a control mechanism coupled to said interface unit and arranged to constrain the amount to which the length of cable is wound and unwound within said cable housing so as to inhibit application of a stretching stress on said cable during rotation of said rotatable unit.

2. A rotatable antenna apparatus as claimed in claim 1, further comprising:
a shaft connected to the rotatable unit and located for rotation within the fixed unit;
the cable housing being located around said shaft.

3. A rotatable antenna apparatus as claimed in claim 1, wherein the length of cable is arranged to move between an inner coiled configuration and an outer coiled configuration within the cable housing during rotation of said rotatable unit.

4. A rotatable antenna apparatus as claimed in claim 1, wherein:
the cable housing comprises a fixed portion and a rotatable portion, the length of cable being connected to both the fixed portion and the rotatable portion; and
the control mechanism is arranged to cause the rotatable portion to rotate during rotation of the rotatable unit.

5. A rotatable antenna apparatus as claimed in claim 4, wherein:
the rotatable unit comprises a support for the antenna assembly and the processing circuitry; and
the control mechanism comprises interengaging formations on the support and on the rotatable portion of the cable housing to cause the rotatable portion to rotate during rotation of the support.

6. A rotatable antenna apparatus as claimed in claim 5, wherein the interengaging formations comprise a protrusion extending from the rotatable portion and a recess in the support configured to receive the protrusion.

7. A rotatable antenna apparatus as claimed in claim 6, wherein said recess is a slot that allows the support to be rotated by a predetermined amount before the rotatable portion begins to rotate.

8. A rotatable antenna apparatus as claimed in claim 5, wherein:
the control mechanism further comprises a calibration mechanism to detect a zero reference point at which the length of cable adopts a first coiled configuration;
the support then being rotatable in a predetermined direction up to a specified maximum angle of rotation during which time rotation of the rotatable portion causes the length of cable to transition from the first coiled configuration to a second coiled configuration, both the first and second coiled configurations being configurations in which the length of cable is not subjected to said stretching stress.

9. A rotatable antenna apparatus as claimed in claim 8, wherein:
the calibration mechanism comprises an actuator freely rotatable between first and second end stops, and a protruding element protruding from the support;
during calibration the support being rotated in a direction opposite to said predetermined direction until the protruding element engages with the actuator and moves the actuator into contact with the first end stop.

10. A rotatable antenna apparatus as claimed in claim 9, wherein the protruding element incorporates a switch mechanism that is activated when the first end stop prevents further movement of the actuator, to indicate that the zero reference point has been reached.

11. A rotatable antenna apparatus as claimed in claim 9, wherein the length of cable is mounted in said cable housing with sufficient slack to allow the length of cable to adopt the first coiled configuration during said calibration without imparting the stretching stress on the cable.

12. A rotatable antenna apparatus as claimed in claim 9, wherein the second end stop provides a physical limit on the amount of rotation that can be applied to the rotating portion of the cable housing in said predetermined direction starting from said zero reference point.

13. A rotatable antenna apparatus as claimed in claim 8, further comprising:
a motor to rotate said support;
the motor being arranged to limit its output so as to ensure that the support is not rotated in said predetermined direction by more than said specified maximum angle of rotation from said zero reference point.

14. A rotatable antenna apparatus as claimed in claim 8, wherein said specified maximum angle of rotation exceeds 360 degrees.

15. A rotatable antenna apparatus as claimed in claim 1, wherein the cable housing is configured to constrain the cable in a predetermined orientation whilst the cable is wound and unwound within said cable housing.

16. A rotatable antenna apparatus as claimed in claim 1, wherein said cable has a rectangular cross-section, and is orientated within the cable housing such that wider sides of the cable face each other in adjacent coils.

17. A rotatable antenna apparatus as claimed in claim 16, wherein an additional cable is interleaved with said cable in the cable housing.

18. A rotatable antenna apparatus as claimed in claim 17, wherein said additional cable has a low surface friction.

19. A rotatable antenna apparatus as claimed in claim 1, wherein said cable is an Ethernet cable.

20. A rotatable antenna apparatus comprising:
a fixed means for attachment of the apparatus to an external structure;
a rotatable means for mounting on the fixed means and comprising an antenna means and processing means coupled to the antenna means for performing signal processing operations;
an interface means for coupling to both the fixed means and the rotatable means, and through which a cable is routed to provide a wired connection from the fixed means to the processing means, the interface means for providing a cable housing within which a length of the cable is enclosed in a coiled arrangement; and a control means for coupling to said interface means and for constraining the amount to which the length of cable is wound and unwound within said cable housing so as to inhibit application of a stretching stress on said cable during rotation of said rotatable means.

\* \* \* \* \*